US007342779B2

(12) United States Patent
Knight

(10) Patent No.: US 7,342,779 B2
(45) Date of Patent: Mar. 11, 2008

(54) ELECTRONIC DEVICE COMPRISING A METAL HOUSING AND A COSMETIC ENVELOPE

(75) Inventor: Simon Knight, Near Porth (GB)

(73) Assignee: Thomson Licensing, Boulogne Billancourt (FR)

( * ) Notice: Subject to any disclaimer, the term of this patent is extended or adjusted under 35 U.S.C. 154(b) by 0 days.

(21) Appl. No.: 11/602,105

(22) Filed: Nov. 20, 2006

(65) Prior Publication Data

US 2007/0115624 A1  May 24, 2007

(30) Foreign Application Priority Data

Nov. 21, 2005  (EP) .................................. 05111047

(51) Int. Cl.
G06F 1/16 (2006.01)
H05K 5/00 (2006.01)
H05K 7/00 (2006.01)

(52) U.S. Cl. ..................................................... 361/683
(58) Field of Classification Search ......... 361/683–686
See application file for complete search history.

(56) References Cited

U.S. PATENT DOCUMENTS

| 4,941,841 | A | | 7/1990 | Darden et al. |
| 5,164,886 | A | * | 11/1992 | Chang ......................... 361/683 |
| 5,311,397 | A | * | 5/1994 | Harshberger et al. ........ 361/683 |
| 5,438,476 | A | * | 8/1995 | Steffes ......................... 361/683 |
| 5,750,545 | A | * | 5/1998 | Akahoshi et al. ............ 514/340 |
| 6,229,696 | B1 | * | 5/2001 | Lin et al. ..................... 361/683 |
| 6,301,103 | B1 | | 10/2001 | Abboud |
| 6,418,011 | B2 | * | 7/2002 | Omori ......................... 361/683 |
| 6,545,874 | B1 | | 4/2003 | Miller et al. |
| 6,741,461 | B1 | * | 5/2004 | Owoeye et al. .............. 361/683 |
| 6,920,040 | B2 | * | 7/2005 | Kim ............................ 361/683 |
| 2003/0233667 | A1 | | 12/2003 | Umipig et al. |
| 2005/0094380 | A1 | | 5/2005 | Mukougawa |

OTHER PUBLICATIONS

Copy of European Search Report dated Jul. 25, 2006.

* cited by examiner

*Primary Examiner*—Javaid H. Nasri
(74) *Attorney, Agent, or Firm*—Joseph J. Laks; Jeffrey M. Navon

(57) ABSTRACT

The present invention concerns an electronic device comprising a set of electronic components, a housing element for lodging the set of electronic components, the housing comprising a top panel, a bottom panel, a front panel, a back panel, a left panel and a right panel, the device comprising an envelope surrounding the housing.

The electronic device is wherein the entire envelope is constituted of a single piece and is fixed to the housing.

1 Claim, 4 Drawing Sheets

ELECTRONIC DEVICE COMPRISING A METAL HOUSING AND A COSMETIC ENVELOPE

This application claims the benefit, under 35 U.S.C. § 119 of European Patent Application 05111047.6, filed Nov. 21, 2005.

BACKGROUND OF THE INVENTION

The present invention relates to an electronic device comprising a housing and a cosmetic envelope.

An electronic device such as a set-top box is a set of electronic components, such as integrated circuits, a processor, memories, fans, etc . . . It generally comprises a metal housing that includes and protects all the electronic components. Externally, the housing comprises the gear necessary to drive the device; e.g. buttons, plugs, displays.

In current generations of such an electronic device, plastic cosmetic box, or casing, has been added around the housing. The cosmetic box is generally made of several pieces of plastic to cover each side of the metal housing. Each piece of plastic is fixed independently to the housing with clips and/or screws.

For example a set-top box is surrounded by a plastic box made of several panels to cover most sides of the set-top box. And it is fixed to the metal box through several screws on each side of the metal box.

With the current design, the access to the housing requires the dismantling of the plastic box. For example in a repair centre, the operator needs to remove all the plastic pieces before accessing the housing. Disassembling and reassembling the device cost time. And it costs additional time when the operator loses a screw, or breaks a piece of plastic. It is therefore desirable to simplify the disassembling and reassembling of the electronic device when it is being serviced.

U.S. Pat. No. 6,545,874 B1 deals with a compact computer arrangement in which components are disposed within an exterior computer housing maximizing space efficiency while remaining accessible.

US2003/0233667 deals with a method and an apparatus for implementing a scaled upgrading of an upgradeable set-top box.

U.S. Pat. No. 4,941,841 deals with an adapter provided for a removable information storage device in an information storage system.

U.S. Pat. No. 6,301,103 B1 deals with an external casing having a modular design for encasing a variety of hardware peripherals within an interior compartment.

US2005/0094380A1 deals with electrical equipment in which a chassis mounting thereto electronic parts can be simply mounted on a bottom of a cabinet without using screws and which can be simply disassembled.

SUMMARY OF THE INVENTION

The present invention concerns an electronic device comprising a housing and a cosmetic envelope, where the envelope is easily assembled to the housing.

To this end, the invention relates to an electronic device comprising a housing element for lodging a set of electronic components, comprising a top panel, a bottom panel, a front panel, a back panel, side panels, a cosmetic envelope surrounding the housing and fixed to the housing, the envelope comprising means for being assembled to form a single piece before it is fastened to the housing, and clipping means for fastening the envelope to the housing.

Having the complete housing with all electronic components in place means that the electronic unit can be fully tested before assembling the outer envelope. This helps reduce the likelihood of marking the cosmetic faces.

Preferably, the clipping means comprises at least a slot arrangement on the bottom panel of the housing for mounting at least a clip of the envelope, and at least a slot arrangement on the top panel of the housing for mounting a at least clip of the envelope.

According to an embodiment, the housing comprises a screw hole, the envelope comprises a screw hole, and said screw holes are facing each other when the envelope has been clipped to the housing.

Preferably, the envelope comprises a top panel, a bottom panel, a front panel, a back panel, side panels so that said envelope surrounds only the front panel, the top panel, and the side panels of the housing.

According to an embodiment, the electronic device is a set-top box.

The invention also concerns a cosmetic envelope intending to surround a housing element for lodging a set of electronic components and to be fixed to the housing. The envelope comprises clipping means for being fastened to the housing, and means for being assembled to form a single piece before it is fastened to the housing.

The invention also concerns a method for fixing an envelope that is constituted of a single piece to a housing element lodging a set of electronic components. The method comprises the following steps of sliding the housing element inside the envelope, clipping on the envelope to the housing; and screwing the envelope to the housing.

The invention also concerns a method for removing an envelope that is constituted of a single piece from a housing element lodging a set of electronic components. The method comprises the steps of unscrewing the envelope from the housing; unclipping on the envelope from the housing; and sliding the housing element outside the envelope.

BRIEF DESCRIPTION OF THE DRAWINGS

The invention will be better understood and illustrated by means of the following embodiment and which will be described, in no way restrictive, with reference to the appended figures among which.

DETAILED DESCRIPTION OF AN EMBODIMENT OF THE INVENTION

Figure 1:
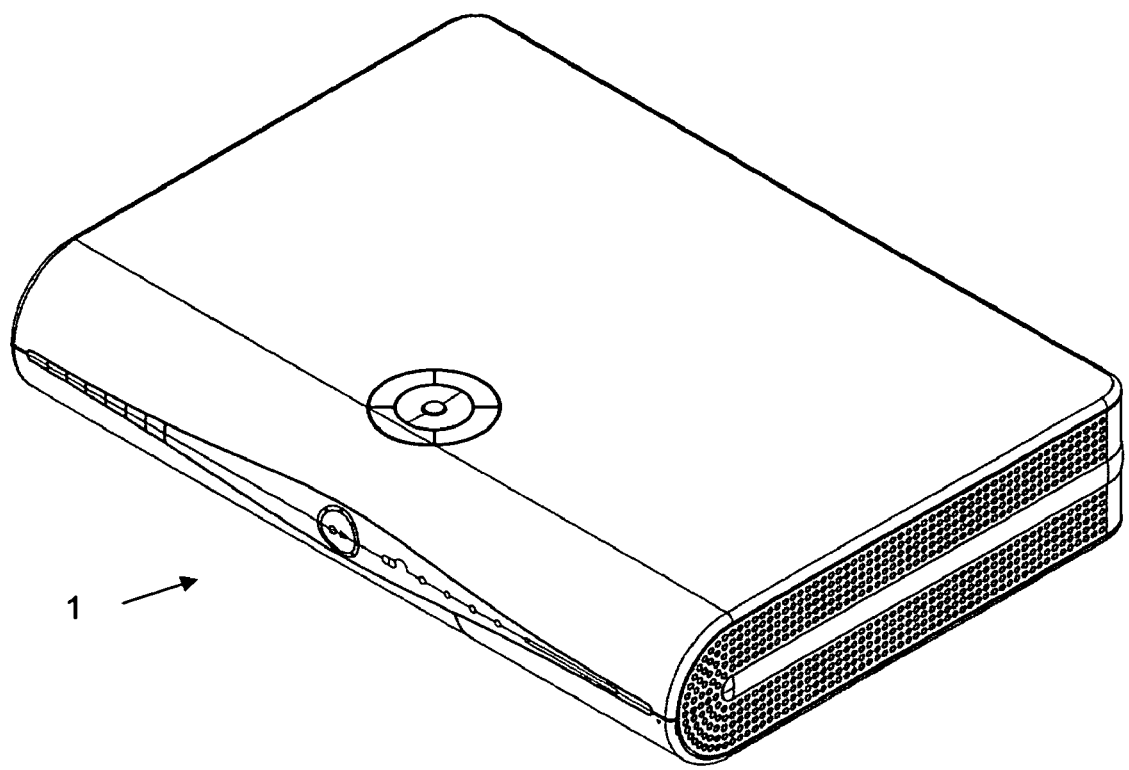
FIG. 1 is a view of the electronic device compliant with the embodiment.

FIG. 1 is a top view of a preferred embodiment of an electronic device (1). It is a set-top box television receiver. In a preferred embodiment the electronic device (1) is a movable object: it can be easily moved from one place to another place. It is not fixed to another device.

Figure 2:
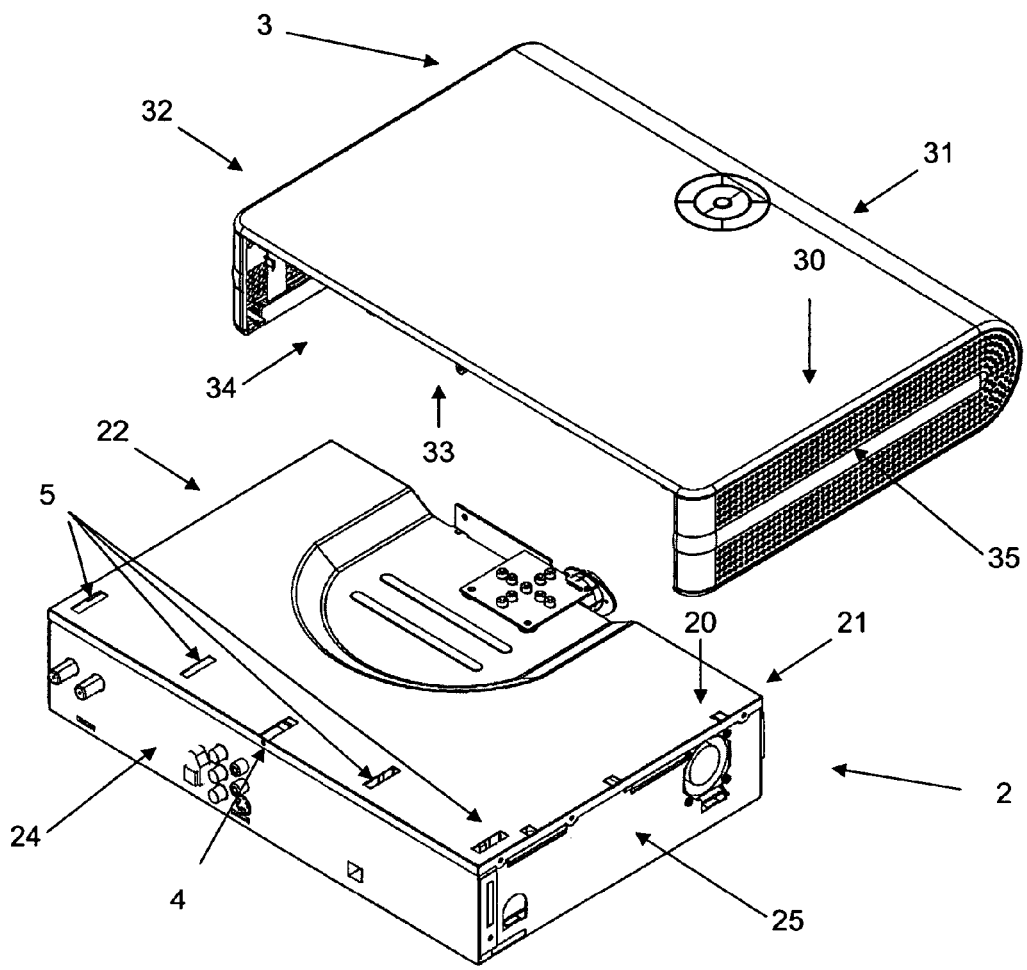
FIG. 2 is a bottom view of the envelope and the housing compliant with the embodiment.

The electronic device (1) comprises a housing (2) preferably made of metal and an envelope (3), as represented in FIG. 2.

The housing (2) is a parallelepiped box that comprises the electronic equipments (not represented) of the electronic device, such as a hard drive, fans, a processor, and integrated circuits, etc . . . It securely protects the electronic equipments. The housing (2) is made of metal to ensure electromagnetic compatibility. It could be made of another material than metal, e.g. plastic, if the other material ensures electromagnetic compatibility, or if there is no such requirement.

The envelope (3) is preferably made of plastic to achieve the required design. The envelope is a single unit that is fixed to the housing.

In an embodiment, the envelope is made of several plastic elements that are attached together. When all the elements are put together to form a single set, the envelope can then be fixed to the housing.

Figure 3:
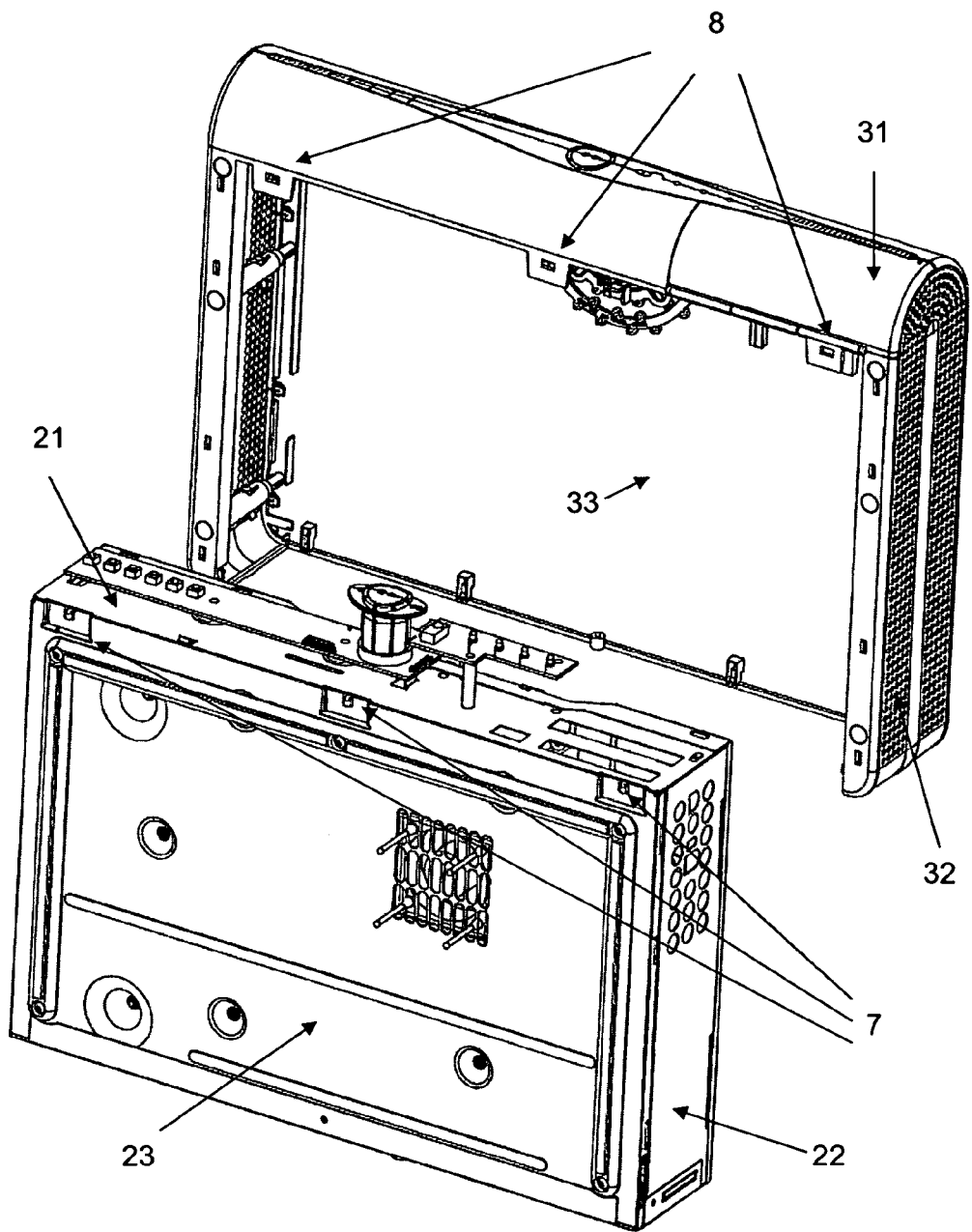
FIG. 3 is a top view of the envelope and the housing compliant with the embodiment.

As indicated on FIGS. 2 and 3, the housing (2) comprises a top panel (20), a bottom panel (23), a front panel (21), a back panel (24), a left panel (25) and a right panel (22). The envelope (3) comprises a top panel (30), a bottom panel (33), a front panel (31), a back panel (34), a left panel (35) and a right panel (32).

In a preferred embodiment, the envelope (3) preferably surrounds only the front panel (21), the top panel (20), the left panel (25) and the right panel (22) of the housing (2). The envelope does not cover the bottom panel and the back panel of the housing. As the primary purpose of the plastic envelope is aesthetic, it is not necessary to cover these panels; the bottom panel and the back panel of the housing are not readily visible to the user when the device is placed in its working environment.

Figure 4:
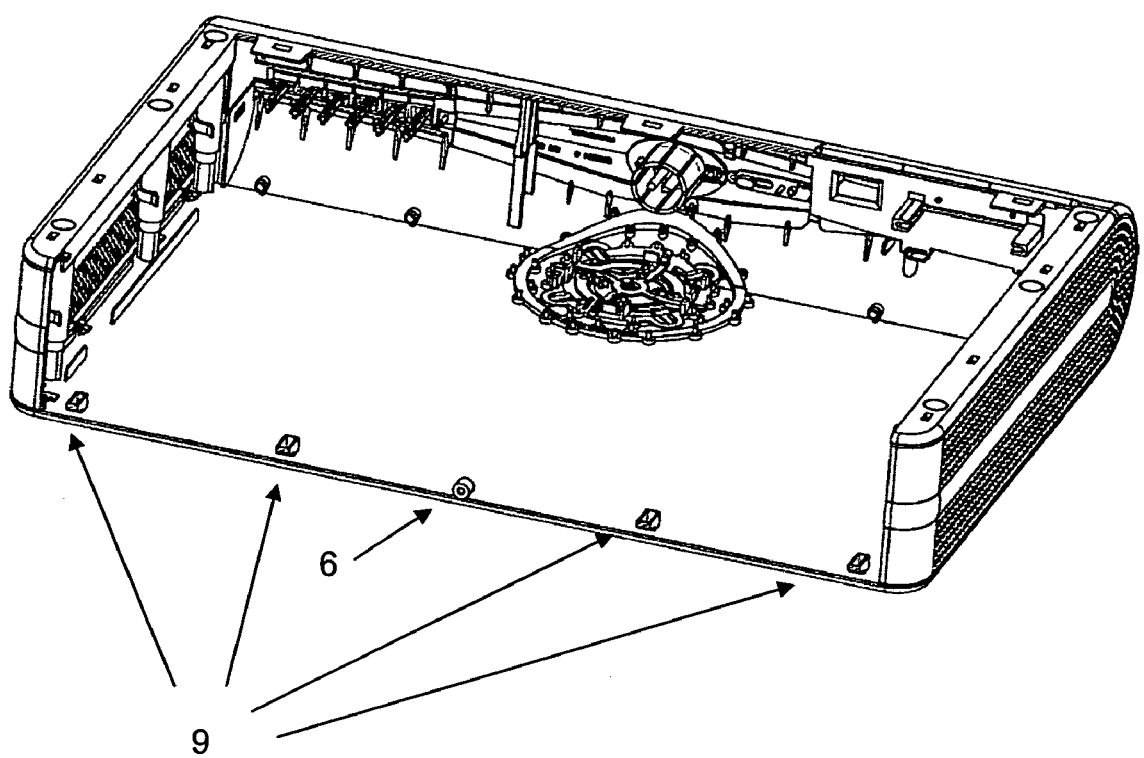
FIG. 4 is a bottom view of the envelope.

The envelope comprises clipping means. In a preferred embodiment, the envelope is fixed to the housing with several clips as indicated on FIGS. 2, 3 and 4. This permits to hold together the envelope and the housing.

The envelope comprises three clips (8) on the bottom panel (33). The housing comprises three slot arrangements (7) in order to be attached to the clips of the envelope.

The envelope also comprises four clips (9) under the top panel (30). And the housing comprises four slots (5) for mounting the four clips (9).

In another embodiment, the envelope is fixed to the housing with a rail system (not represented). The housing slides into the envelope between two rails located inside the envelope on the right panel and on the left panel, until the front panel of the housing rests against the internal side of the front panel of the envelope.

The envelope comprises a screw hole (6) and the housing comprises a screw hole (4). When the envelope is clipped on the housing, the screw holes are facing each other.

Only one screw is required to fix the envelope to the housing. This is mainly used for safety, because the envelope and the housing are already and sufficiently attached with the clipping means. If the latching means are broken, the screw permits to keep the envelope attached to the housing.

Moreover, when the envelope is made of several plastic elements that are attached together, the screw permits to secure the fastening of all plastic elements together when the envelope is fixed to the housing.

With the clip system and the single screw, the envelope is then easily attached and detached to/from the housing.

The method to attach the envelope to the housing is as follows. First the housing slides into the envelope from the back panel towards the front panel of the envelope. Then the envelope is clipped on the housing. Finally, as the screw hole of the envelope faces the screw hole of the housing, the envelope is screwed to the housing.

To detach the envelope from the housing, the first step is to unscrew the envelope from the housing. Then it is necessary to unclip the clips of the envelope from the slots of the housing.

The present embodiment applies to a set-top box. It is also applicable to any device running in the same kind of working environment. It is applicable to any device comprising a housing for lodging a set of electronic gear surrounded by a cosmetic envelope. Some examples of such devices are a video player, a video recorder, an audio unit.

The invention claimed is:

1. An electrical appliance comprising a housing element for lodging a set of electronic components and an envelope fixed to said housing, said housing comprising a top panel, a bottom panel, a front panel, a back panel, a left panel and a right panel;

said envelope comprising a top cover, a front cover in a shape of a curvature, a bottom cover which is formed by said curvature of said front cover folded inwardly, a back side of said front cover, a left cover and a right cover so that said envelope surrounds only said front panel, said top panel, said left panel and said right panel of said housing, said housing slides into said envelope from an open back side of said envelope toward said front cover of said envelope;

said envelope further comprising at least one first clip on said bottom cover, at least one second clip on said bottom of said top cover and a first screw hole in line with said at least one second clip;

said envelope being constituted of either a single piece or several elements attached together;

said housing further comprising at least one first slot arrangement on said top panel for connecting with said at least one first clip, at least one second slot arrangement on said bottom panel in order to be attached to at least one second clip of said envelope, and a second screw hole in line with first slot so that said first and said second screw holes are facing each other to be screwed together with a screw when said envelope is clipped on said housing.

* * * * *